July 26, 1960 J. S. MAYO 2,946,897

DIRECT COUPLED TRANSISTOR LOGIC CIRCUITS

Filed March 29, 1956

INVENTOR
J. S. MAYO

BY Alan C. Rose

ATTORNEY

United States Patent Office 2,946,897

Patented July 26, 1960

2,946,897

DIRECT COUPLED TRANSISTOR LOGIC CIRCUITS

John S. Mayo, Newark, N.J., assignor to Bell Telephone Laboratories, Incorporated, New York, N.Y., a corporation of New York Filed Mar. 29, 1956, Ser. No. 574,819

12 Claims. (Cl. 307—88.5)

This invention relates to transistor switching circuits.

In the field of electronic switching circuits, it is frequently desirable to produce output signals in accordance with a preassigned pattern of two-valued input signals. Circuits of this type have been termed "logic" circuits. Thus, for example, a circuit yielding an output signal when all input circuits are energized is termed an "AND" circuit. A circuit yielding an output signal when any or all of its terminals are energized has been termed an "OR" circuit. A circuit having two input terminals and yielding an output signal when either one but not both input circuits are energized has been termed an "anticoincidence" circuit, or an "exclusive OR" circuit.

A principal object of the present invention is to simplify and improve logic circuits of the type designated "AND" circuits and "anticoincidence" circuits.

In accordance with a simple version of the present invention, the collectors of two transistors are connected in parallel, and the bases and emitters of the transistors are cross connected. In such an arrangement, the application of a control voltage to one of the cross connections energizes one of the transistors and biases the emitter to base circuit of the other transistor to cutoff. If control voltages are applied to both cross connections, both transistors remain de-energized. Therefore, when the collectors of the two transistors are connected to a common load resistor, and two additional transistors are provided to supply control voltages to the respective cross connections, the resultant circuit is a simple anticoincidence circuit.

More complex logic circuits having generally similar properties may also be constructed. For example, when three or more transistors are connected with their collectors in parallel, and the base of each transistor is interconnected with the emitter of the next successive transistor in a ring, a logic circuit is produced which yields an output signal when all inputs to the interconnections are energized or when none are energized. Furthermore, this circuit may be transformed into a multiple input AND circuit by grounding the emitter of one of the transistors.

Other objects and various features and advantages of the invention will be apparent from the following detailed description taken in conjunction with the attached drawings, and from the appended claims.

Figure 1:
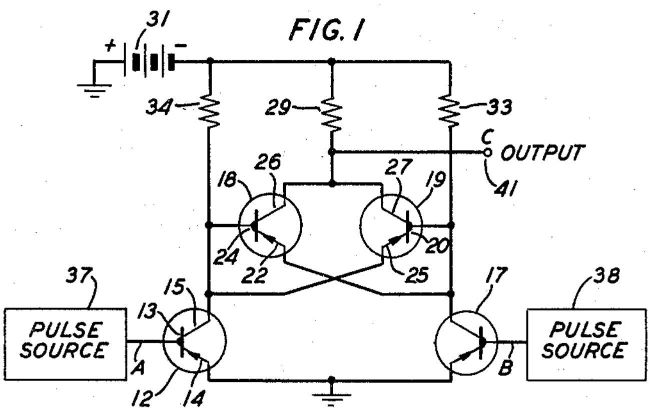
Fig. 1 is a schematic circuit of an anticoincidence circuit in accordance with the invention.

Referring more particularly to the drawings, Fig. 1 shows, by way of example, an anticoincidence circuit which employs only four transistors. The transistors employed in the circuit of Fig. 1 are p-n-p junction transistors. Other transistors which also have low collector to emitter resistance when energized, and which become de-energized when the base and emitter are at the same potential may be employed. Thus, referring to the transistor 12 of Fig. 1, for example, when the base electrode 13 and the emitter electrode 14 are both grounded, practically no current flows in the circuit including collector 15.

In Fig. 1, the two transistors 12 and 17 are the active elements of the input circuits, while the logic circuit itself includes the two transistors 18 and 19. As mentioned in the introduction, the bases and emitters of the transistors 18 and 19 are cross connected. Thus, the base electrode 20 of transistor 19 is connected to the emitter electrode 22 of transistor 18, and the base electrode 24 of the transistor 18 is connected to the emitter electrode 25 of the transistor 19. The collectors 26 and 27 of the transistors 18 and 19 are connected together, and to the common load resistor 29. For the p-n-p transistors employed in Fig. 1, negative collector voltage is supplied by the voltage source 31. The voltage source is also connected to the bases 20 and 24 by resistors 33 and 34, respectively.

The pulse sources 37 and 38 are connected to the input transistors 12 and 17, respectively. When the bases of transistors 12 and 17 are at ground potential, the collector circuits are open-circuited. Accordingly, both of the transistors 18 and 19 are also cut off, and no current flows in the load resistor 29. When a negative pulse is applied to the base 13 of transistor 12 by the pulse source 37, the impedance of the collector to emitter circuit of the transistor 12 changes from a virtual open circuit to a virtual short circuit. Under these circumstances, the potential of the emitter 25 of the transistor 19 changes from a substantial negative value to ground potential. The base 20 of transistor 19 is, however, maintained at a negative potential by the voltage source 31 through the circuit including resistor 33. The transistor 19 is therefore energized, and the resultant voltage drop across the load resistor 29 produces an output pulse at terminal 41.

In the preceding paragraph, it has been shown that transistor 19 is energized when a negative pulse is applied to the base 13 of transistor 12. Similarly, the transistor 18 is energized when the transistor 17 is energized by a negative pulse from the source 38. Output pulses therefore appear at terminal 41 when pulses are supplied from either pulse source 37 or pulse source 38.

When coincident pulses are supplied from the pulse sources 37 and 38, both of the control transistors 12 and 17 are energized. When this occurs, all of electrodes 20, 22, 24, and 25 are reduced to the same low potential, which is nearly ground potential. When the emitter and base of any of the transistors have approximately the same potential, the collector is effectively open-circuited. Accordingly, neither transistor 18 nor transistor 19 will be energized, and no output pulse will appear at terminal 41.

The circuit of Fig. 1 therefore yields output pulses when either input circuit is energized, but not when both are energized. Consequently, it constitutes an anticoincidence or exclusive OR circuit.

Figure 1A:
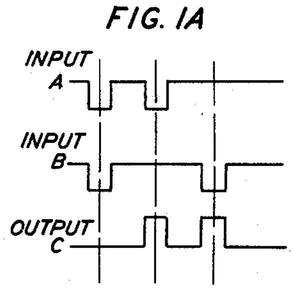
Fig. 1A is a diagram showing the response of the circuit of Fig. 1 to input signals.

Fig. 1A shows the output pulses at terminal 41 designated "C," in response to input signals on leads A and B from pulse sources 37 and 38, respectively. As indicated in Fig. 1A, output pulses at C are produced when pulses are present at input lead A or input lead B, but not when pulses are applied to both input leads. In the embodiment shown in Fig. 1, the input pulses are negative-going, while the output pulses are positive-going pulses. It is to be understood, however, that simple inversion circuits may be employed to reverse the polarity of the output pulses when such reversal is desired. In addition, the circuit of Fig. 1 will operate properly in response to positive signals if n-p-n transistors and a positive collector voltage source are substituted.

Figure 2:
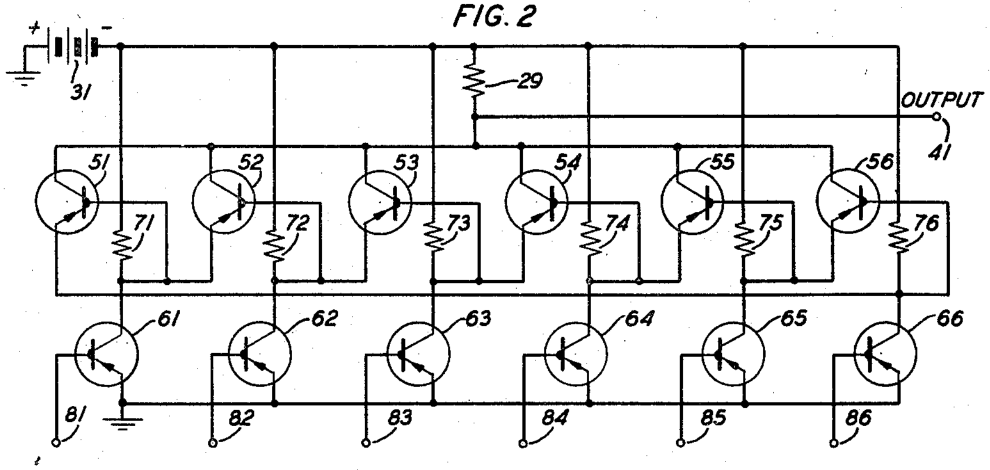
Fig. 2 is a schematic circuit of a logic circuit which yields an output signal when all inputs are energized or when none are energized.

The circuit of Fig. 2 is a more elaborate logic circuit which has one output state when all or none of the input circuits are energized, and another output state when some but not all of the input circuits are energized. In the circuit of Fig. 2, the load resistor 29, the output circuit 41, and the voltage supply 31 are all equivalent to the comparable components of Fig. 1 which bear the same numbers. In addition, the transistors 51 through 56 in Fig. 2 perform much the same function as the transistors 18 and 19 of Fig. 1. Similarly, the resistors 71 through 76 correspond to the resistors 33 and 34 of Fig. 1.

In Fig. 2, each of the transistors 51 through 55 has its base directly connected to the emitter of the next higher numbered transistor. To complete the ring of base to emitter interconnections, the transistor 56 has its base directly connected to the emitter of the transistor 51. When no control voltages are applied to any of the base-emitter interconnections, none of the transistors 51 through 56 are energized. Under these circumstances, no current flows in the load resistor 29. Similarly, when control voltages of nearly equal magnitude are applied to all of the interconnections, the base and emitter electrodes of all of transistors 51 through 56 are at the same potential, and the transistors all remain de-energized.

When a control voltage is applied to at least one but not all of the interconnections, the potential at the emitter of at least one of the transistors 51 through 56 becomes more positive than the potential at the base. The energization of this transistor causes current flow in the load resistor 29, and produces an output pulse at terminal 41.

The transistors 61 through 66 correspond to the transistors 12 and 17 of Fig. 1, and supply control voltages to the base to emitter interconnections of the transistors 51 through 56. Suitable pulse sources (not shown) are coupled to each of the input terminals 81 through 86.

As explained in detail above, the circuit of Fig. 2 assumes one state when all or none of the input terminals 81 through 86 are energized. When some but not all of the input terminals 81 through 86 are energized, current flows in the load resistor 29, and the output terminal 41 assumes a more positive potential. A circuit such as that of Fig. 2 is sometimes termed an "all-one or all-zero" detector.

Figure 3:
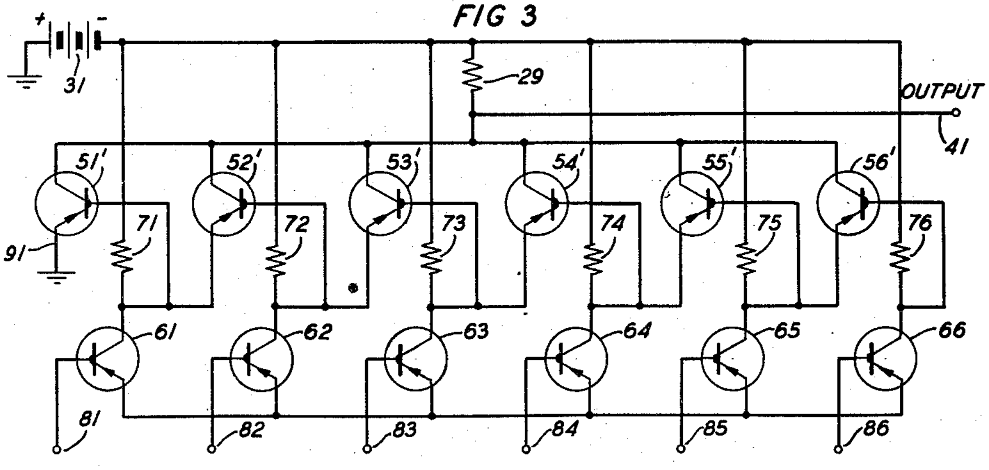
Fig. 3 is a schematic circuit of a six-input AND circuit.

Fig. 3 shows an AND circuit having six inputs. The circuit of Fig. 3 is very similar to that of Fig. 2. In fact, the only difference between the two circuits is the connection to the emitter of the transistor 51' in Fig. 3, which corresponds to the transistor 51 in Fig. 2. Instead of being connected to the base of the transistor 56', the emitter 91 of transistor 51' is grounded. With its emitter 91 grounded, the transistor 51' conducts current even when there is no signal applied to any of the input terminals 81 through 86. With the circuital arrangement of Fig. 3, therefore, all of the input terminals 81 through 86 must be energized in order to bring the emitters and bases of all of transistors 51' through 56' to the same potential (ground) and thus de-energize them. The circuit of Fig. 3 therefore assumes one state when all six input terminals are energized, and another state when none or any lesser number of the input terminals are energized. It therefore constitutes a six-terminal AND circuit.

In the drawings, it may be noted that the emitters and collectors of transistors 18 and 19 in Fig. 1 and of transistors 51 through 56 of Figs. 2 and 3 are shown directly interconnected. These direct connections should be conductive connections, and should not include more than a few hundred ohms resistance. The conductive nature of the connections permits operation in response to direct current input signals, or pulse signals of a very low repetition rate.

In the circuits of Figs. 2 and 3, n-p-n transistors may be substituted with an appropriate change in polarity of the biasing voltages, as was previously pointed out with respect to Fig. 1.

It is to be understood that the above-described arrangements are illustrative of the application of the principles of the invention. Numerous other arrangements may be devised by those skilled in the art without departing from the spirit and scope of the invention.

What is claimed is:

1. An anticoincidence circuit comprising a first group of transistors having their emitters connected together, a load resistor, a second group of transistors having their collectors connected directly together and to said load resistor, said transistors being of the direct coupled transistor logic type, circuit means connecting the collector of a first transistor in said first group directly to the emitter of one transistor in said second group and to the base of another transistor in said second group, means for connecting the collector of a second transistor in said first group directly to the base of said one transistor in said second group and to the emitter of another transistor in said second group, and means for applying binary electrical signals to the bases of said first group of transistors.

2. In combination, two transistors of the direct coupled transistor logic type, a first cross connection directly interconnecting the base of a first one of said transistors and the emitter of a second transistor, a second cross connection directly interconnecting the emitter of said first transistor and the base of said second transistor, a load resistor having one terminal directly connected to the collectors of both of said transistors, and individual circuit means for applying control voltages to said first and to said second cross connections.

3. In combination, a first group of transistors having their emitters connected together, a second group of transistors having their collectors connected together, said transistors being of the direct coupled transistor logic type, circuit interconnection means for applying signals from the collector of a first transistor in said first group to the emitter of one transistor in said second group and to the base of another transistor in said second group, and circuit interconnection means for applying signals from the collector of a second transistor in said first group to the base of said one transistor in said second group and to the emitter of another transistor in said second group.

4. In combination, two transistors having their base and emitter circuits directly cross connected, said transistors being of the direct coupled transistor logic type, individual circuits for applying control voltages to each of the cross connections, and a common load resistance connected to the collectors of both of said transistors.

5. In combination, two transistors of the direct coupled transistor logic type, a first cross connection directly interconnecting the base of a first one of said transistors and the emitter of the second transistor, a second cross connection directly interconnecting the emitter of said first transistor and the base of said second transistor, individual circuit means for applying control voltages to said first and to said second cross connections, and a common load resistor having one terminal connected to the collectors of both of said transistors.

6. In combination, at least two transistors of the direct coupled transistor logic type, individual coupling circuits directly intercoupling the emitter of each of said transistors with the base of another transistor, control circuits for applying signals to each of said coupling circuits, and a common load resistor having one terminal connected to the collectors of said transistors.

7. The combination as set forth in claim 6 further comprising means for applying energizing voltage to the collectors of said transistors through said common load resistor.

8. In combination, two transistors of the direct coupled transistor logic type, a first cross connection directly interconnecting the base of a first one of said transistors and the emitter of the second transistor, a second cross connection directly interconnecting the emitter of said first transistor and the base of said second transistor, individual circuit means for applying control voltages to said first and to said second cross connections, a common load resistor having one terminal connected to the collectors of both of said transistors, and additional circuit means including a resistor connected to each of said cross connections for supplying base current to said transistors.

9. In combination, a first group of transistors having their emitters connected together, a second group of transistors having their collectors connected together, said transistors being of the direct coupled transistor logic type, circuit interconnection means for applying signals from the collector of a first transistor in said first group to the emitter of one transistor in said second group and to the base of another transistor in said second group, circuit interconnection means for applying signals from the collector of a second transistor in said first group to the base of said one transistor in said second group and to the emitter of another transistor in said second group, a load impedance, and means for applying energizing voltage to the collectors of all of the transistors in said second group through said load impedance.

10. In combination, a first group of transistors having their emitters connected together, a second group of transistors having their collectors connected together, said transistors being of the direct coupled transistor logic type, circuit interconnection means for applying signals from the collector of a first transistor in said first group to the emitter of a first transistor in said second group and to the base of a second transistor in said second group, and circuit interconnection means for applying signals from the collector of a second transistor in said first group to the base of said first transistor in said second group and to the emitter of a third transistor in said second group.

11. The combination as set forth in claim 10 wherein each of said second group transistors has its emitter connected to the base of another of said second group transistors.

12. The combination as set forth in claim 10 wherein each of said second group transistors except one has its emitter connected to the base of another of said second group transistors, said one second group transistor emitter being connected directly to ground.

References Cited in the file of this patent

UNITED STATES PATENTS

| | | |
|---|---|---|
| 2,540,539 | Moore | Feb. 6, 1951 |
| 2,550,116 | Grosdoff | Apr. 24, 1951 |
| 2,760,062 | Hobbs | Aug. 21, 1956 |
| 2,768,290 | Harris et al. | Oct. 23, 1956 |
| 2,806,153 | Walker | Sept. 10, 1957 |
| 2,815,486 | Estes | Dec. 3, 1957 |

FOREIGN PATENTS

| | | |
|---|---|---|
| 1,096,793 | France | Feb. 2, 1955 |
| 162,171 | Australia | Mar. 24, 1955 |

OTHER REFERENCES

Pub. 1, Directly Coupled Transistor Circuits by Beter et al. in Electronics, June 1955, pp. 132–134.

Pub. 2, Transistor Cathode Follower by Hellmers in Radio and Television News, October 1953, p. 169.

Notice of Adverse Decision in Interference

In Interference No. 92,136 involving Patent No. 2,946,897, J. S. Mayo, Direct coupled transistor logic circuits, final judgment adverse to the patentee was rendered Mar. 7, 1962, as to claims 2, 4, 5, 6, 7, and 8.

[*Official Gazette, April 17, 1962.*]